(12) United States Patent
Weiberle et al.

(10) Patent No.: US 8,190,971 B2
(45) Date of Patent: May 29, 2012

(54) DATA PROCESSING SYSTEM AND METHOD FOR OPERATING A DATA PROCESSING SYSTEM

(75) Inventors: Reinhard Weiberle, Vaihingen/Enz (DE); Eberhard Boehl, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 969 days.

(21) Appl. No.: 12/065,454

(22) PCT Filed: Jul. 28, 2006

(86) PCT No.: PCT/EP2006/064800
§ 371 (c)(1),
(2), (4) Date: Jul. 2, 2008

(87) PCT Pub. No.: WO2007/025817
PCT Pub. Date: Mar. 8, 2007

(65) Prior Publication Data
US 2008/0270830 A1 Oct. 30, 2008

(30) Foreign Application Priority Data
Aug. 30, 2005 (DE) .......................... 10 2005 040 917

(51) Int. Cl.
*G11C 29/00* (2006.01)
(52) U.S. Cl. ........................................ 714/763; 714/764
(58) Field of Classification Search .................. 714/763, 714/764, 53, 54
See application file for complete search history.

(56) References Cited

U.S. PATENT DOCUMENTS

| 3,286,239 A | 11/1966 | Thompson et al. |
| 4,535,455 A | 8/1985 | Peterson |
| 4,604,751 A * | 8/1986 | Aichelmann et al. ......... 714/723 |
| 4,661,955 A * | 4/1987 | Arlington et al. .............. 714/6.1 |
| 5,978,953 A * | 11/1999 | Olarig ........................... 714/768 |
| 6,675,341 B1 * | 1/2004 | Chen et al. .................... 714/753 |
| 6,701,480 B1 * | 3/2004 | Karpuszka et al. ........... 714/764 |
| 6,925,581 B2 * | 8/2005 | Hommel ......................... 714/14 |
| 7,299,400 B2 * | 11/2007 | Yusa ............................. 714/764 |

FOREIGN PATENT DOCUMENTS

| DE | 14 49 529 | 1/1970 |
| DE | 100 63 934 | 6/2002 |
| DE | 102 20 811 | 1/2003 |
| EP | 0 096 783 | 12/1983 |
| JP | 61-169940 | 7/1986 |

OTHER PUBLICATIONS

International Search Report, PCT International Patent Application No. PCT/EP2006/064800, dated Feb. 13, 2007.

* cited by examiner

*Primary Examiner* — Yolanda L Wilson
(74) *Attorney, Agent, or Firm* — Kenyon & Kenyon LLP

(57) ABSTRACT

To improve the availability of a data processing system despite possible memory errors, when reading a data word from a memory cell, the integrity of the data word is checked on the basis of redundant additional information, and if the data word turns out to be corrupted, an error correction procedure is performed in which the reliability performance of the memory cell is checked and, if the memory cell is found to be operational, its contents are restored.

22 Claims, 2 Drawing Sheets

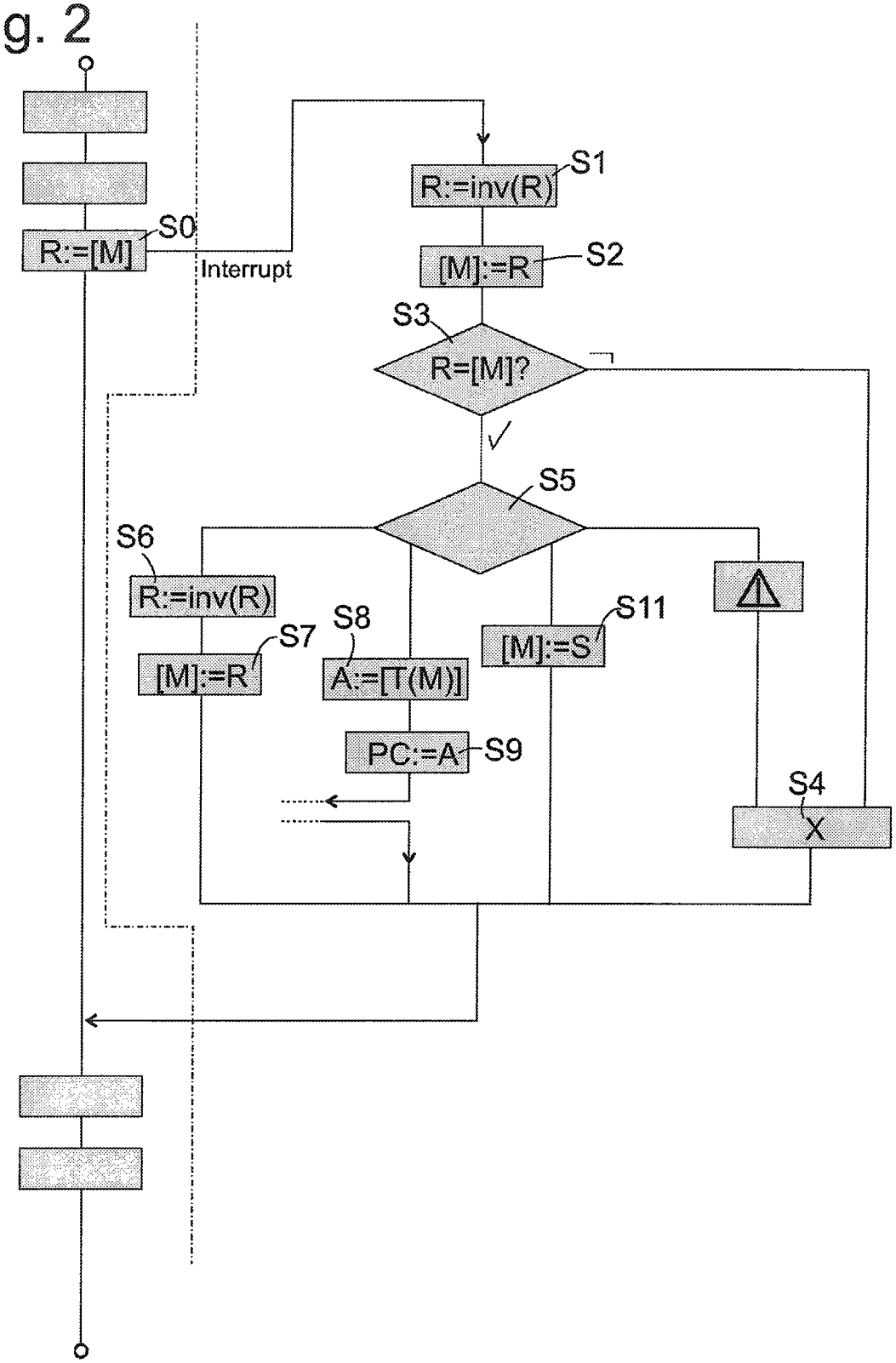

DATA PROCESSING SYSTEM AND METHOD FOR OPERATING A DATA PROCESSING SYSTEM

FIELD OF THE INVENTION

The present invention relates to a method for operating a data processing system and a data processing system which is designed for carrying out the operating method.

BACKGROUND INFORMATION

Systems for digital data processing are increasingly used for controlling complex, safety-critical processes, in particular in the automobile industry. To ensure the safety of the users of such a system, i.e., a motor vehicle in which such a system is used, even in the event of malfunction, the occurrence of a malfunction must be recognized as rapidly as possible and, if necessary, suitable corrective measures must be taken. These corrective measures often depend on disabling the data processing system or at least those parts of the system which are affected by the malfunction. For example, German Published Patent Application No. 100 63 934 discloses a data processing system in the form of a network having a plurality of control units running a plurality of monitoring routines which trigger different shut-off strategies for control units of the network when an error is detected. The different shut-off strategies prevent the need for shutting off the entire network when an error is detected so that those components not affected by the error may continue to run. However, even the shut-off of individual components results in a limitation of the reliability performance of the network.

German Published Patent Application No. 102 20 811 proposes the implementation of a flexible response to different types of errors which may occur in a data processing system with the aid of a modular monitoring method oriented toward the functional units of the system to be monitored. Orientation toward the functional units of the system results in the structure of the monitoring method being dependent on the system to be monitored. Adapting this method to a new application is therefore laborious.

SUMMARY

Example embodiments of the present invention provide a method for operating a data processing system which is easily adaptable to data processing systems for different tasks and ensures high availability of the data processing system itself in the event that certain errors are detected in the system.

These advantages are achieved in that a method for operating a data processing system includes the following steps
a) reading of a data word from a memory cell;
b) checking of the integrity of the data word on the basis of redundant additional information; and
c) in the case in which the data word turns out to be corrupted, performing of an error handling procedure having the following steps:
d) checking of the reliability performance of the memory cell and, if the memory cell is found to be operational,
e) restoring of its contents.

The method is independent of a weight content which the data word has for an application program running on the data processing system. It may therefore contain either a program instruction or also parameters.

Restoration may be restoration to its original state or, if the data value is time-variable, also updating of the contents of the memory cell.

When the contents of the memory cell have been restored, the data processing system may continue to perform its actual function; it is no longer necessary to shut off the data processing system or parts thereof.

This property of the method is advantageous in particular in modern data processing systems which use memories having high integration density because in these memories the likelihood of spontaneous data loss due to the effect of particle radiation, in particular of alpha particles, increases as the dimensions of a memory cell affected by a radiation particle decrease.

To check the reliability performance of the memory cell, preferably the following steps are performed:
d1) writing to the memory cell;
d2) reading back of the memory cell written to; and
d3) comparing of the read-back data word with the one previously written to the memory cell.

If agreement is found in the comparison, it may be assumed that previous data loss of the memory cell was caused by a transient external effect and not by a defect of the memory cell itself, i.e., that the memory cell may continue to be used and the risk of repeat data loss is not greater in this case than for other cells of the memory.

The data word written to the memory cell in step d1) is preferably the binary complement of the data word read in step a) because then a single write operation is sufficient for checking that each bit of the memory cell is capable of assuming the values 0 and 1.

While it is also possible to write a predefined data word to the memory cell, two write-read-back and comparison operations each with binarily complementary data words would be required to verify the reliability performance of the memory cell.

In an example embodiment, the contents of the memory cell may therefore be restored by writing the data word read in step a) back to the memory cell in step e). This is practicable if the data word being briefly corrupted may not have any safety-relevant effect on the system and it has been ensured that the possibly corrupted data word is corrected at a later point in time via an update.

It is safer to update the contents of the memory cell in step e). This alternative is, however, more complicated to implement because procedures for updating the contents may be different from one memory cell to the other; the error handling procedure is therefore unable to handle all memory cells in the same manner. If periodic updating of the memory cell is provided anyway by an application running on the data processing system, it may be sufficient to simply discard the corrupted data value and wait for the update.

An alternative that is easy to use on any memory cell is that the redundant information contains error correction information (such as ECC) and the contents of the memory cell are corrected in step e) on the basis of the error correction information.

Two or more of the above-described alternatives may be used jointly in a method in that the mode of performing step e) is selected on the basis of the address of the memory cell.

If the memory cell is found not to be operational in step d), a routine accessing the memory cell should be terminated in order to avoid malfunctions of this routine that may jeopardize safety.

If step a) is performed by a programmable circuit under the control of an application program, steps c) through e) are preferably performed within an interrupt of the application program. Access of the application program to the memory cell prior to restoration of the memory cell's contents is thus impossible.

If the application program includes a real-time function and a data word is identified as corrupted during an access by the real-time function, an interrupt of the application program for checking the reliability performance of the memory cell, and possibly restoring its contents, may negatively affect the real-time function by delaying it. To prevent such a case whenever possible, the application program may include a background function which is interruptible by any real-time function and which performs step a) for a plurality of memory cells one immediately after the other. An aspect of the background function is therefore to read the memory cells so that an error in a memory cell is detected, if possible, during a non-time-critical access of the background function to the memory cell and may be corrected by an interrupt. It is not necessary for the background function to further process the read data words.

The subject matter hereof is also a data processing system having a data memory and a program-controlled circuit which is programmed to carry out the above-described method. Such a data processing system may be a motor vehicle control unit in particular.

Further features and advantages of example embodiments of the present invention are derived from the following description taking into account the appended drawings.

BRIEF DESCRIPTION OF THE DRAWINGS

FIG. 2 shows a flow chart of the operating method according to an example embodiment of the present invention.

DETAILED DESCRIPTION

Figure 1:
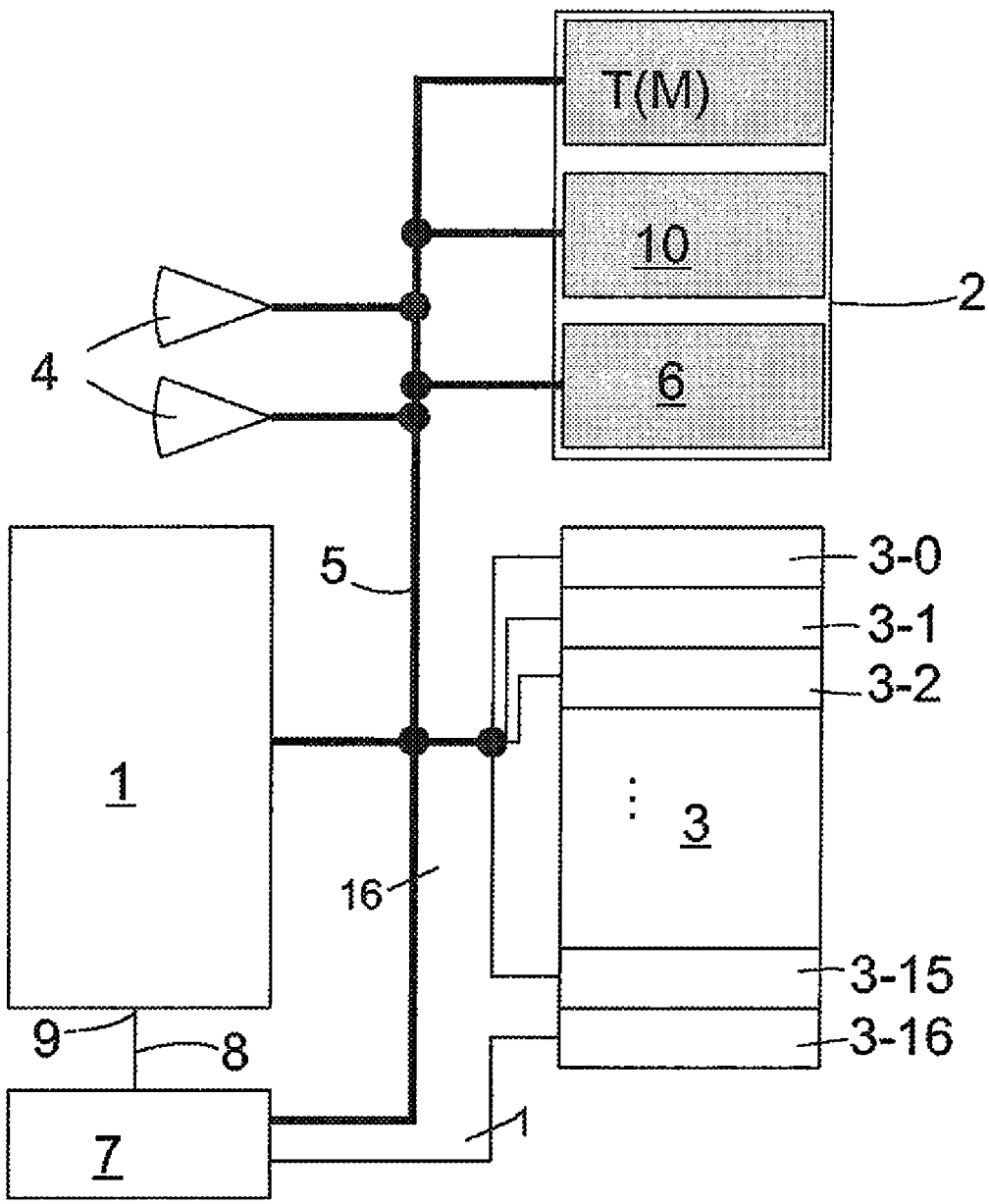
FIG. 1 shows a block diagram of a data processing system according to an example embodiment of the present invention.

FIG. 1 schematically shows a data processing system in which an example embodiment of the present invention is implemented. The system includes a microprocessor 1, a read-only memory 2, a read-write memory 3, and various sensors 4 and actuators which are connected to each other via a data bus 5 and an address bus. Sensors 4 and actuators are used for detecting and affecting performance parameters of a device to be controlled, for example, a motor vehicle engine. The manner in which the measured values generated by sensors 4 are processed by microprocessor 1 to activate the actuators is determined by an application program stored in area 6 of ROM 2.

Data bus 5 between memories 2, 3 and processor 1 has a width of 16 bits, for example.

The width of read-write memory 3 is 1 bit greater than that of data bus 5; the additional bit is used for storing a parity bit for each 16-bit data word. Read-write memory 3 is shown in the figure divided into sections 3-0 through 3-16, each of which receives one of bits 0 through 15 of each data word and the corresponding parity bit. Section 3-16 receiving the parity bit has a data input and data output which are connected to a parity controller 7, which generates the correct parity bit for each data word to be written to read-write memory 3 and outputs it to section 3-16, so that it is stored together with the data word, and calculates the parity of each data word read from the memory, comparing it with the parity read from section 3-16 at the same time. In the event of non-agreement, there is an error in memory 3, and parity controller 7 generates an error signal which is supplied to an interrupt input 9 of microprocessor 1 via a line 8.

An error handling routine which is to be run by microprocessor 1 in the event of an error signal occurring at interrupt input 9 is stored in an area 10 of ROM 2. The application program controls and/or regulates the engine via a loop executed in regular time intervals, in which it reads measuring results which were previously stored by sensors 4 at the addresses of memory 3 assigned to them, processes these measuring results and activates the actuators on the basis of the processing results. When this activation is completed and there is time left until the start of the next loop, the application program reads the individual memory locations of read-write memory 3, not to further process the contents read, but only to enable parity controller 7 to check the correctness of the contents of the individual memory cells. While an interrupt triggered by parity controller 7 during control and regulation processing may result in a delay of time-critical tasks of microprocessor 1, this is not the case in successive readings of the memory cells after the completion of the control and regulation tasks. The time during which this reading takes place represents the capacity reserve of microprocessor 1 and it may, if necessary, also be used for performing error handling without negatively affecting the other functions of the microprocessor.

FIG. 2 is a flow chart of an error handling procedure of microprocessor 1 triggered by an interrupt of parity controller 7. Step S0 designates a read step of contents [M] of a memory cell having address M in a register R of microprocessor 1, in which parity controller 7 identifies a parity error. The error signal subsequently output by parity controller 7 results in an interrupt of the application program being executed by microprocessor 1 and in the execution of an error handling procedure in whose first step S1 the contents of register R are replaced by their binary complement inv(R). In step S2 the contents of register R are written to the memory cell having address M.

When the identified parity error has been caused by a defective bit of the memory cell which may assume only one of the two possible logical values, the write procedure of step S2 for this bit remains without effect.

In step S3 the contents [M] of memory cell M are read again and compared to register R. If the memory cell actually has a corrupted bit, non-agreement is identified and the method branches off to step S4, in which the application program or at least separable portions of this program which access memory cell M are terminated.

When agreement is found in step S3, it may be assumed that the parity error is caused by spontaneous information loss in a bit of memory cell M, for example, due to the effect of ionizing radiation, and indicates no permanent defect of memory cell M. In this case memory cell M may continue to be used.

The manner in which the contents of memory cell M are to be restored is then decided in step S5. The way this is to be done may differ depending on the meaning of the data word stored in memory cell M and may be determined at the time the application program is developed, for example, in the variables of the application program which are stored in the address areas associated with the type of error handling and are to be handled the same way in the event of an error.

When an error in the variables stored in memory cell M may be tolerated, for example, because the variable is regularly recalculated on the basis of the measuring results of sensors 4 and a briefly corrupted value of the variables may not result in safety-relevant miscontrol, it is sufficient if the method branches off to step S6 in which, however, the register is inverted and subsequently in step S7 memory cell M is overwritten with the value thus obtained. Memory cell M then has the same contents again as in step S0. While there is a high probability of these contents being corrupted, as long as the error does not affect the most significant bits, it is at least a better approximation of the correct value than an arbitrarily defined constant.

It is also possible to replace a value of a memory cell determined to be corrupted with a predefined value such as 0x0000 or 0xFFFF which is recognized as invalid by the application program accessing the corresponding memory cell. The appropriate response to the error may then be left to the application program and it may turn out to be different depending on which values other variables currently have or the phase of the application program from which the defective memory cell was accessed.

There may be another group of memory cells whose contents may be remeasured by sensors 4 or recalculated without major effort in the event of an error. Routines for recalculating or measuring these values are, in general, part of the application program. A table T(M) in ROM 2 provides a start address A of a routine for each memory cell M of this type, via which contents [M] may be recalculated or measured. This address A is ascertained in step S8, and a jump to it is performed in step S9 to execute the corresponding routine and restore [M].

There may be another group of memory cells M in which the risk associated with the use of a corrupted value is unacceptably high, so that simple restoration of [M] via steps S6, S7 is out of the question, and which are inaccessible even for rapid redetermination via steps S8, S9. These may include variables obtained by averaging over a longer period, or discrete variables whose effects do not continuously change with their numerical value. When the memory cell which triggered the parity error belongs to this group, a warning signal is output to a user in step S10 to prompt him to restart the data processing system, and subsequently the method goes to step S4 in which functions using memory cell M are blocked until the correct contents of M are restored by a system reboot.

Another possibility is to make backup copies of certain variables so that, when defective memory cell M contains such a variable, its backup copy S may be simply read and written back to memory cell M (S11).

An example embodiment of the present invention may include further options for correcting contents of a memory cell identified as corrupted or also a subset of the above-described options. In the simplest case, decision step S5 may also be omitted and only a single option may be provided.

According to an example embodiment of the present invention, memory 3 has not only one redundant bit 3-16 for each data word, but multiple bits, whose contents are determined from the associated data word with the aid of an error correction code such as a Reed-Solomon code, and the redundant bits are addressable by microprocessor 1, so that the microprocessor may also read them. In the example embodiment of FIG. 1, parity controller 7 is used for identifying errors in the read data words on the basis of the redundant bits it receives simultaneously with each data word and for triggering an interrupt of processor 1 in the event of an error. During such an interrupt—or as one of the plurality of possible options available in step S5 of this interrupt for eliminating the memory error—processor 1 reads the redundant bits for the corrupted data word, corrects the corrupted data word on the basis of these bits, and writes it back to the memory cell affected by the error.

What is claimed is:

1. A method for operating a data processing system, comprising:
   reading of a data word from a memory cell;
   checking an integrity of the data word on the basis of redundant additional information; and
   in the case in which the data word turns out to be corrupted, performing of an error handling procedure;
   wherein the error handling procedure includes checking a reliability performance of the memory cell and, if the memory cell is found to be operational, restoring contents of the memory cell, and wherein a manner in which the restoring step is executed is selected on the basis of an address of the memory cell, and wherein the restoring step includes overwriting the memory cell with one of: (i) a predefined value; (ii) a measured value; or (iii) a previously stored back-up value.

2. The method according to claim 1, wherein the check of reliability performance includes:
   writing to the memory cell;
   reading back of the memory cell written to; and
   comparing of a read-back data word with the data word previously written to the memory cell.

3. The method according to claim 2, wherein the data word written to the memory cell is a binary complement of the data word read in the reading step.

4. The method according to claim 3, wherein the data word read in the reading step is written back to the memory cell in the restoring step.

5. The method according to claim 3, wherein the contents of the memory cell are updated in the restoring step.

6. The method according to claim 3, wherein the redundant additional information includes error correction information, and the contents of the memory cell are corrected on the basis of the error correction information in the restoring step.

7. The method according to claim 1, wherein, if the memory cell is found not to be operational, a routine accessing the memory cell is terminated.

8. The method according to claim 1, wherein the reading step is performed by a programmable circuit under control of an application program, and the error handling procedure is performed within an interrupt of the application program.

9. The method according to claim 8, wherein the application program includes at least one real-time function and one background function interruptible by any real-time function, and the background function performs the reading step for a plurality of memory cells one immediately after the other.

10. A data processing system, comprising:
    a data memory including a memory cell; and
    a program-controlled circuit programmed to perform a method for operating the data processing system, the method including:
    reading of a data word from the memory cell;
    checking an integrity of the data word on the basis of redundant additional information; and
    in the case in which the data word turns out to be corrupted, performing of an error handling procedure;
    wherein the error handling procedure includes checking a reliability performance of the memory cell and, if the memory cell is found to be operational, restoring contents of the memory cell, and wherein a manner in which the restoring step is executed is selected on the basis of an address of the memory cell, and wherein the restoring step includes overwriting the memory cell with one of: (i) a predefined value; (ii) a measured value; or (iii) a previously stored back-up value.

11. The data processing system according to claim 10, wherein the data processing system is arranged as a motor vehicle control unit.

12. A method for operating a data processing system which includes microprocessor, comprising:

reading of a data word from a memory cell by a programmable circuit under the control of an application program;

checking an integrity of the data word on the basis of redundant additional information; and in the case in which the data word turns out to be corrupted, performing of an error handling procedure;

wherein the error handling procedure includes checking a reliability performance of the memory cell and, if the memory cell is found to be operational, restoring contents of the memory cell;

wherein sensors are used for detecting operating parameters for a device to be controlled, and wherein measured values generated by the sensors are processed by the microprocessor;

wherein the application program includes at least one real-time function and a background function interruptible by any real-time function, and wherein the background function repeats in direct succession the reading of a data word for a plurality of memory cells;

wherein the application program reads the individual memory cells in order to check the integrity of the data words in the individual memory cells; and wherein the restoring step includes remeasuring a content of a memory cell by the sensors which detect the operating parameters for the device to be controlled and generate the measured values, and wherein the application program includes routines for measurement by the sensors.

13. The method according to claim 12, wherein the check of reliability performance includes:

writing to the memory cell;

reading back of the memory cell written to; and comparing of a read-back data word with the data word previously written to the memory cell.

14. The method according to claim 13, wherein the data word written to the memory cell is a binary complement of the data word read in the reading step.

15. The method according to claim 14, wherein the data word read in the reading step is written back to the memory cell in the restoring step.

16. The method according to claim 14, wherein the contents of the memory cell are updated in the restoring step.

17. The method according to claim 14, wherein the redundant additional information includes error correction information, and the contents of the memory cell are corrected on the basis of the error correction information in the restoring step.

18. The method according to claim 12, wherein a manner in which the restoring step is executed is selected on the basis of an address of the memory cell.

19. The method according to claim 12, wherein, if the memory cell is found not to be operational, a routine accessing the memory cell is terminated.

20. The method according to claim 12, wherein the error handling procedure is performed within an interrupt of the application program.

21. A data processing system, comprising:

a data memory including memory cells; and a microprocessor including a programmable circuit programmed to perform a method for operating the data processing system, the method including:

reading of a data word from a memory cell by the programmable circuit under the control of an application program;

checking an integrity of the data word on the basis of redundant additional information; and in the case in which the data word turns out to be corrupted, performing of an error handling procedure;

wherein the error handling procedure includes checking a reliability performance of the memory cell and, if the memory cell is found to be operational, restoring contents of the memory cell;

wherein sensors are used for detecting operating parameters for a device to be controlled, and wherein measured values generated by the sensors are processed by the microprocessor;

wherein the application program includes at least one real-time function and a background function interruptible by any real-time function, and wherein the background function repeats in direct succession the reading of a data word for a plurality of memory cells;

wherein the application program reads the individual memory cells in order to check the integrity of the data words in the individual memory cells; and wherein the restoring step includes remeasuring a content of a memory cell by the sensors which detect the operating parameters for the device to be controlled and generate the measured values, and wherein the application program includes routines for measurement by the sensors.

22. The data processing system according to claim 21, wherein the data processing system is arranged as a motor vehicle control unit.

\* \* \* \* \*